US005323391A

United States Patent [19]
Harrison

[11] Patent Number: 5,323,391
[45] Date of Patent: Jun. 21, 1994

[54] MULTI-CHANNEL DIGITAL TRANSMITTER AND RECEIVER

[75] Inventor: Robert M. Harrison, Grapevine, Tex.

[73] Assignee: Motorola, Inc., Schaumburg, Ill.

[21] Appl. No.: 27,981

[22] Filed: Mar. 8, 1993

Related U.S. Application Data

[63] Continuation-in-part of Ser. No. 966,630, Oct. 22, 1992.

[51] Int. Cl.⁵ .............................................. H04J 1/02
[52] U.S. Cl. ......................................... 370/70; 364/572; 364/576; 364/724.01; 364/724.1; 364/724.13; 375/102; 375/103; 455/307
[58] Field of Search ................... 370/70; 375/60, 99, 375/102, 103; 455/63, 303, 306, 307; 364/724.01, 724.1, 724.13, 724.16, 724.17, 572, 574, 576, 577

[56] References Cited

U.S. PATENT DOCUMENTS

| | | | |
|---|---|---|---|
| 4,112,374 | 9/1978 | Steinbrecher | 325/446 |
| 4,230,956 | 10/1980 | Steinbrecher | 307/257 |
| 4,785,447 | 11/1988 | Ichiyoshi | 370/70 |
| 4,876,542 | 10/1989 | van Bavel et al. | 341/143 |
| 5,043,933 | 8/1991 | Boutaud et al. | 364/724.1 |

OTHER PUBLICATIONS

Hogenauer, Eugene B., "An Economical Class of Digital Filters for Decimation and Interpolation", *IEEE Transactions on Acoustics, Speech, and Signal Processing*, vol. ASSP-29, No. 2, Apr. 1981.

Crochiere, Ronald E. and Lawrence R., *Multirate Digital Signal Processing*, Chapter 7, "Multirate Techniques in Filter Banks and Spectrum Analyzers and Synthesizers", pp. 289-313, 1983.

Harris Semiconductor Digital Processing Databook, "Numerically Controlled Oscillator/Modulator", HSP45116, pp. 5-26/5-40, Harris Corporation 1992.

Primary Examiner—Douglas W. Olms
Assistant Examiner—Russell W. Blum
Attorney, Agent, or Firm—Shawn B. Dempster

[57] ABSTRACT

A method and apparatus are provided for use in a multi-channel digital transmitter and receiver. A filtering process is accomplished by conditioning portions of a digitized signal during digital signal processing by integrating, taking the difference of, and multiplying portions of the digitized signal. The filtering process may be used in conjunction with a receiving process to generate a digitized channel signal by conditioning the digitized signal and subsequently Fourier transforming the conditioned portions of the digitized signal. Alternatively, the filtering process may be used in conjunction with a transmitting process by inverse Fourier transforming a plurality of digitized information signals to be transmitted to generating a composite digitized signal and subsequently conditioning the composite digitized signal.

59 Claims, 4 Drawing Sheets

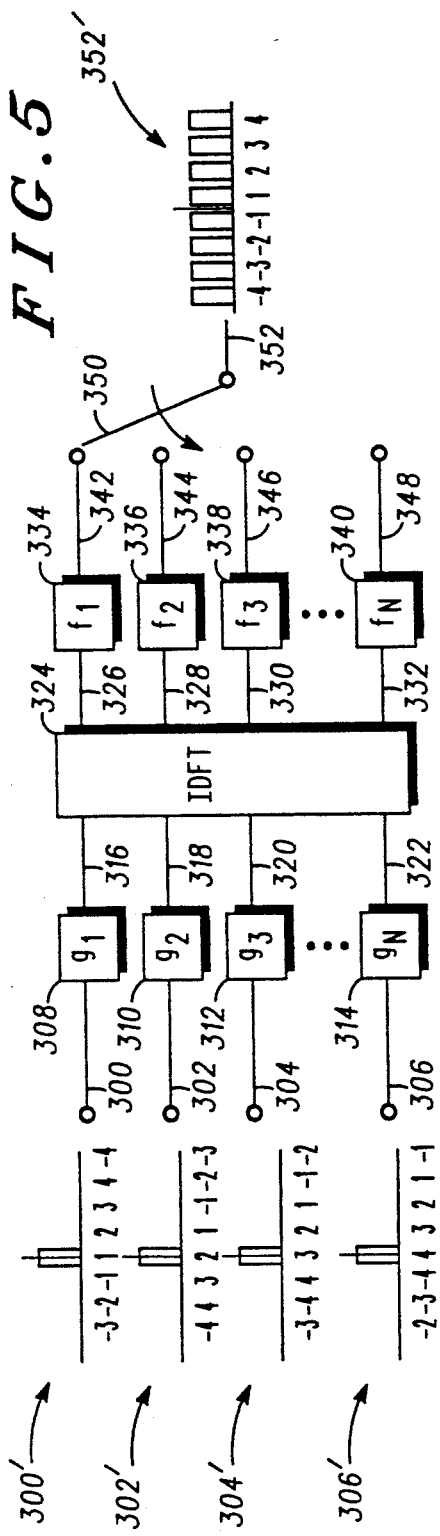
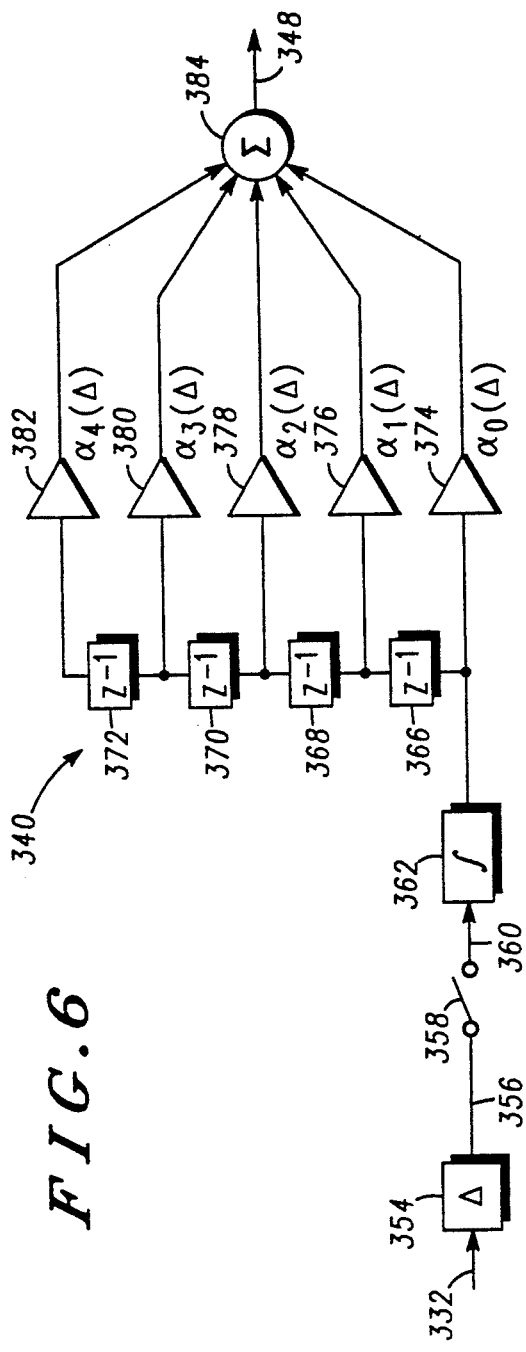

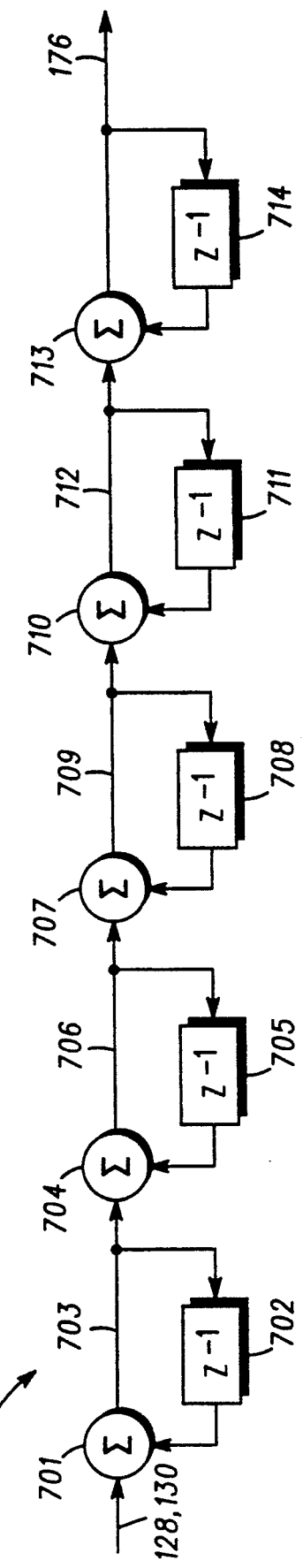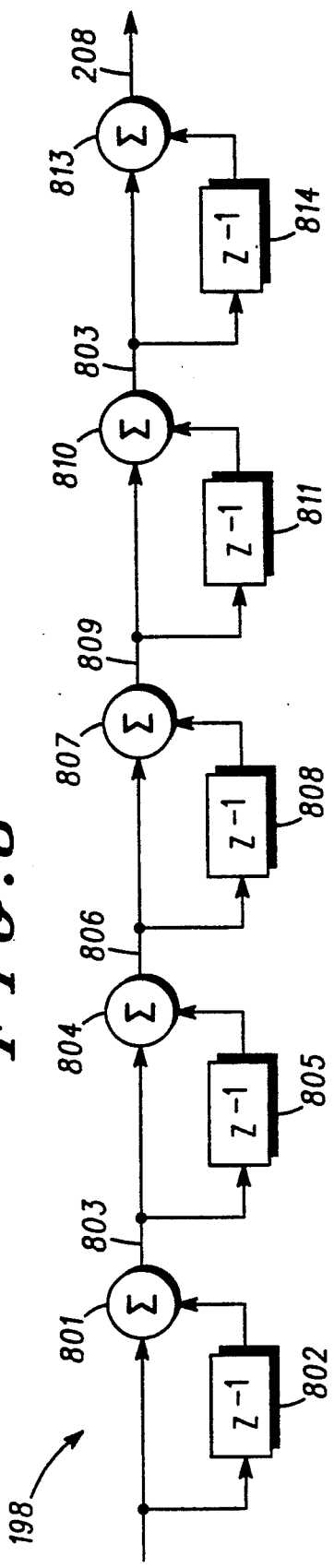

MULTI-CHANNEL DIGITAL TRANSMITTER AND RECEIVER

CROSS REFERENCE TO RELATED APPLICATION

This is a continuation-in-part of U.S. patent application Ser. No. 07/966,630 entitled "A Method and Means for Transmultiplexing Signals Between Signal Terminals and Radio Frequency Channels" which was filed on Oct. 22, 1992 for the same inventor, Mark Harrison, as the present patent application and is also assigned to Motorola, Inc., is directed to a multi-channel digital transmitter and receiver which use a polyphase filter bank to pre- and post-process digital signals, respectively, which are used in conjunction with a Fourier transformer.

FIELD OF THE INVENTION

The present invention relates to communication units which manipulate electromagnetic radiation within a frequency band, and more specifically to a multi-channel receiver which detects a plurality of information signals as well as a multi-channel transmitter which prepares a plurality of information signals for subsequent transmission over a communication channel.

BACKGROUND OF THE INVENTION

Transmitters and receivers for communication systems generally are designed such that they are tuned to transmit and receive one of a multiplicity of signals having widely varying bandwidths and which may fall within a particular frequency range. It will be appreciated by those skilled in the art that these transmitters and receivers radiate or intercept, respectively, electromagnetic radiation within a desired frequency band. The electromagnetic radiation can be output from or input to the transmitter or receiver, respectively, by several types of devices including an antenna, a wave guide, a coaxial cable, an optical fiber, and a transducer.

These communication system transmitters and receivers may be capable of transmitting and receiving a multiplicity of signals; however, such transmitters and receivers generally utilize circuitry which is duplicated for each respective signal to be transmitted or received which has a different frequency or bandwidth. This circuitry duplication is not an optimal multi-channel communication unit design architecture, because of the added cost and complexity associated with building complete independent transmitters and/or receivers for each communication channel.

An alternative transmitter and receiver architecture is possible which would be capable of transmitting and receiving signals having a desired multi-channel wide bandwidth. This alternative transmitter and receiver may utilize a digital-to-analog converter and a digitizer (analog-to-digital converter) which operates at a sufficiently high sampling rate to ensure that the signal of the desired bandwidth can be digitized in accordance with the Nyquist criterion (e.g., digitizing at a sampling rate equal to at least twice bandwidth to be digitized). Subsequently, the digitized signal preferably is pre- or post-processed using digital signal processing techniques to differentiate between the multiple channels within the digitized desired bandwidth. Such a communication unit structure is essentially equivalent to a single radio frequency (RF) and intermediate frequency (IF) band analog signal processing portion followed by or preceded by a single digital processing portion which manipulates the digitized signal as if it represented multiple communication channels.

It will be appreciated by those skilled in the art that another possible technique for providing this type of communication unit structure is through the use of Discrete Fourier Transforms (DFT's) in a DFT bank and Inverse Discrete Fourier Transforms (IDFT's) in an IDFT bank or similar digital filtering techniques, to synthesize a series of adjacent narrow bandwidth channels.

The disadvantage to this alternative type of communication unit is that the digital processing portion of the communication unit must have a sufficiently high sampling rate to ensure that the Nyquist criterion is met for the maximum bandwidth of the received electromagnetic radiation which is equal to the sum of the individual communication channels which form the composite received electromagnetic radiation bandwidth. If the composite bandwidth signal is sufficiently wide, the digital processing portion of the communication unit may be very costly and may consume a considerable amount of power. Additionally, the channels produced by a DFT or IDFT filtering technique must typically be adjacent to each other. Thus, the sampling rate for these filtering techniques is necessarily restricted to an integer multiplier of N times the number of possible communication channels (e.g., N, 2N, 3N . . . possible communication channels).

A need exists for a transmitter and a receiver, like the one which is described above, which is capable of transmitting and receiving a multiplicity of signals within corresponding channels with the same transmitter or receiver circuitry. However, this transmitter and receiver circuitry preferably should reduce communication unit design constraints associated with the digital signal processors (DSPs) which implement DFT and IDFT functions. If such a transmitter and receiver architecture could be developed, then it would be ideally suited for cellular radiotelephone communication systems. Cellular base stations typically need to transmit and receive multiple channels within a wide frequency bandwidth (e.g., 825 MegaHertz to 894 MegaHertz). In addition, commercial pressures on cellular infrastructure and subscriber manufacturers is prompting these manufacturers to find ways to reduce the cost of communication units. Similarly, such a multi-channel transmitter and receiver architecture would be well suited for personal communication systems (PCS) which will have smaller service regions (than their counterpart cellular service regions) for each base station and as such a corresponding larger number of base stations will be required to cover a given-geographic region. Operators, which purchase base stations ideally would like to have a less complex and a reduced cost per unit to install throughout their licensed service regions.

Current and future cellular and PCS communication systems have information signal coding and channelization standards (i.e., air interface standards) which share at least one common characteristic. The characteristic is that all of the systems include communication channels which are allocated substantially the same amount of frequency bandwidth for each channel (i.e., each communication channel uses the same frequency bandwidth). A number of current and future planned information signal coding and channelization standards (i.e., open air interface standards) exist. These coding and channelization standards which have channels allocated in equal portions of frequency bandwidth include channelization structures based on frequency division multiple access, time division multiple access, and frequency hopping code division multiple access. Some of the current and future planned coding and channelization standards have names including: Advanced Mobile Phone Service (AMPS), Narrow Advanced Mobile Phone Service (NAMPS), Total Access Communication System (TACS), Japanese Total Access Communication System (JTACS), United States Digital Cellular (USDC), Japan Digital Cellular (JDC), Groupe Special Mobile (GSM), Frequency Hopping Spread Spectrum (FH-SS), Cordless Telephone 2 (CT2), Cordless Telephone 2 Plus (CT2 Plus), and Cordless Telephone 3 (CT3). It will be appreciated by those skilled in the art that, although digital communication open air interfaces typically have a group including more than one communication channel that occupies the same frequency bandwidth, the channels within the group are separated from one another by a code (e.g., the code may be time slots within a time frame or the code may be slots within a frequency hopping pattern). Further, each group of channels utilizes the same frequency bandwidth as each other group of channels operating according to the same open air interface.

An additional advantage may be gained by cellular and PCS manufacturers as the result of designing multi-channel communication units which share the same analog signal portion. Traditional communication units which are designed to operate under a single information signal coding and channelization standard. In contrast, these multi-channel communication units include a digital signal processing portion which may be reprogrammed, at will, through software during the manufacturing process or in the field after installation such that these multi-channel communication units may operate in accordance with any one of several information signal coding and channelization standards.

SUMMARY OF THE INVENTION

A method and apparatus is provided for use in a multi-channel digital transmitter and receiver. A filtering process is accomplished by conditioning portions of a digitized signal during digital signal processing by integrating, taking the difference of, and multiplying portions of the digitized signal.

In addition, a method and apparatus is provided for utilizing the filtering process within a receiving process. The receiving process is accomplished by utilizing a plurality of filters to pre-condition a digitized signal for subsequent Fourier transformation. Each filter conditions a portion of the digitized signal by integrating, taking the difference of, and multiplying a portion of the digitized signal. Subsequently, a Fourier transformer generates a digitized channel signal from the pre-conditioned portions of the digitized signal. Alternatively, the receiving process may be described as utilizing an analog-to-digital converter to digitize a selected portion of an input frequency band. Subsequently, a commutator subdivides the digitized portion of the input frequency band into the plurality of digitized signal portions. Then, a discrete Fourier transformer generates a plurality of digitized channel signals by discrete Fourier transforming the plurality of digitized signal portions. Finally, a detector detects at least two information signals from the plurality of digitized channel signals.

Similarly, a method and apparatus is provided for utilizing the filtering process within a transmitting process. The transmitting process is accomplished by utilizing an inverse Fourier transformer to generate a composite digitized signal from a plurality of digitized information signals which are to be transmitted. Subsequently, a plurality of filters post-conditions the composite digitized signal for subsequent transmission. Each filter post-conditions a portion of the composite digitized signal by integrating, taking the difference of, and multiplying a portion of the composite digitized signal. Alternatively, the transmitting process may be described as utilizing an inverse discrete Fourier transformer to generate a plurality of digitized signals by inverse discrete Fourier transforming a plurality of input digitized information signals. Subsequently, a commutator combines portions of the plurality of digitized signals into a composite digitized signal. Then, an analog-to-digital converter generates a composite analog transmission signal from the composite digitized signal. Finally, transmitter transmits the composite analog transmission signal over a frequency band.

BRIEF DESCRIPTION OF THE DRAWINGS

FIG. 5 is a block diagram showing a portion of the preferred embodiment transmitter shown in FIG. 4.

FIG. 6 is a block diagram showing a preferred embodiment filter in accordance with the present invention for use in the preferred embodiment transmitter shown in FIGS. 4 and 5.

FIG. 7 is a block diagram showing a preferred embodiment fifth order integrator in accordance with the present invention for use in the preferred embodiment receiver and transmitter shown in FIGS. 1 through 6.

FIG. 8 is a block diagram showing a preferred embodiment fifth order differencer in accordance with the present invention for use in the preferred embodiment receiver and transmitter shown in FIGS. 1 through 6.

DETAILED DESCRIPTION

It will be appreciated by those skilled in the art that although the following discussion is directed to a particular preferred embodiment receiver and transmitter communication unit for use in a cellular or PCS communication system, the principles discussed herein can be readily applied to other wireline, radio, or satellite telecommunication systems as well as data communication systems without departing from the scope and spirit of the present invention.

The preferred embodiment communication unit in accordance with the present invention as described below permits the manipulation of one or more information signals within a multiplicity of communication channels. The number of communication channels which can be received is determined by the frequency bandwidth of the signals to be received. Any combination of coded and channelized signals in between these bounds may be obtained and the channelization is not restricted to immediately adjacent channels within a frequency band. The receiver's channel bandwidths may also be modified by changing the signal processing algorithms. This allows the reuse of existing hardware and minimizes the need to replace hardware when the air interface standards of the communication system (e.g., cellular radiotelephone, paging, or any other wireline or wireless communication system) change or are expanded.

Figure 1:
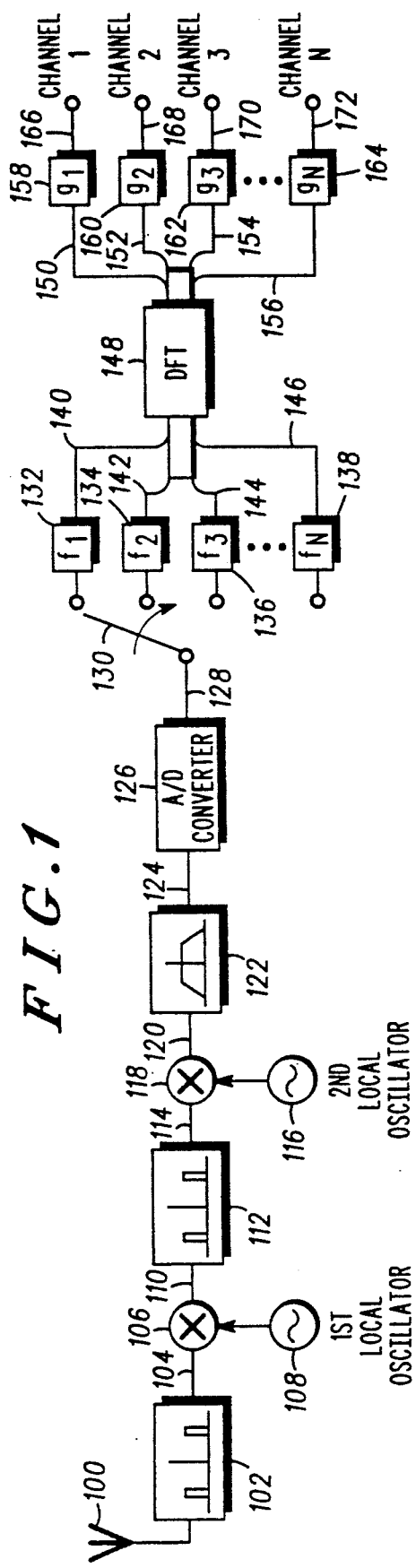
FIG. 1 is a block diagram showing a preferred embodiment receiver in accordance with the present invention.

Referring now to FIG. 1, a block diagram of a preferred embodiment multi-channel receiver in accordance with the present invention is shown. It will be appreciated that communication units also typically include transmitter circuitry (such as the one shown and described later in reference to FIGS. 4–6). The preferred embodiment receiver is preferably included within a communication unit (e.g., a cellular base station, a cellular portable phone, a patio phone, a pager, or a trunked radio) for receiving electromagnetic radiation within a frequency band containing multiple communication channels. For the purposes of the following discussion, the preferred embodiment communication unit is described for use in an AMPS or NAMPS analog cellular radiotelephone communication system (as described in Electronic Industrial Association standard EIA-553 and interim standards IS-88, IS-89, and IS-90). The communication channels used by each cell or service region (served by a base site) are typically assigned according to a channel reuse separation pattern (e.g., a 21-cell or 24-cell reuse pattern). This type of channel assignment based on a reuse separation pattern reduces co-channel and adjacent channel interference. Therefore, each base site is designed to receive only a subset of all available communication channels (i.e., 1/21 or 1/24 of all available channels). It will be appreciated by those skilled in the art that other reuse separation patterns may be used by an AMPS or NAMPS communication system and as such each base site will need to be designed to receive the number of channels available for serving the cell or service region served by the base site.

The receiver preferably includes an input such as an antenna 100 which intercepts electromagnetic radiation within the frequency band of interest and transducer (not shown) for converting the intercepted electromagnetic radiation into an electrical signal. It will be appreciated by those skilled in the art that other types of input devices may be used for intercepting or capturing electromagnetic radiation. For example a wave guide, a coaxial cable, an optical fiber, or an infrared frequency transducer may be used to intercept electromagnetic radiation for subsequent input into the preferred embodiment receiver.

The receiver preferably consists of a front end (analog portion) consisting of elements known to those skilled in the art that provide a low noise figure and ample protection to undesired out-of-band signals. These elements consist of a preselect band pass filter 102. The output electrical signal 104 of the preselect band pass filter 102 is input to a down converter. The down converter consists of a mixer 106, a local oscillator 108, and a band pass filter 112. The oscillator 108 preferably is a fixed frequency oscillator; however, as will be appreciated by those skilled in the art a frequency agile local oscillator may be used in place of the fixed frequency oscillator without departing from the scope and spirit of the present invention. The electrical signal 104 is operatively coupled to one input of the mixer 106 and the output of the oscillator 108 is provided to another input of mixer 106. Mixer 106 mixes the electrical signal 104 down to an intermediate frequency band electrical signal 110. Subsequently, the intermediate frequency (IF) band electrical signal 110 is filtered by a band pass filter 112 to eliminate undesired frequency components into a conditioned IF band electrical signal 114.

Subsequently, the IF band electrical signal 114 is input to another down converter. This down converter consists of a mixer 118, a frequency agile local oscillator 116, and a low pass filter 122. The electrical signal 114 is operatively coupled to one input of the mixer 118 and the output of the oscillator 116 is provided to another input of mixer 118. Mixer 118 mixes the IF band electrical signal 114 down to a baseband electrical signal 120. Subsequently, the baseband electrical signal 120 is filtered by a low pass filter 122 to eliminate undesired frequency components into a conditioned baseband electrical signal 124.

Figure 2:
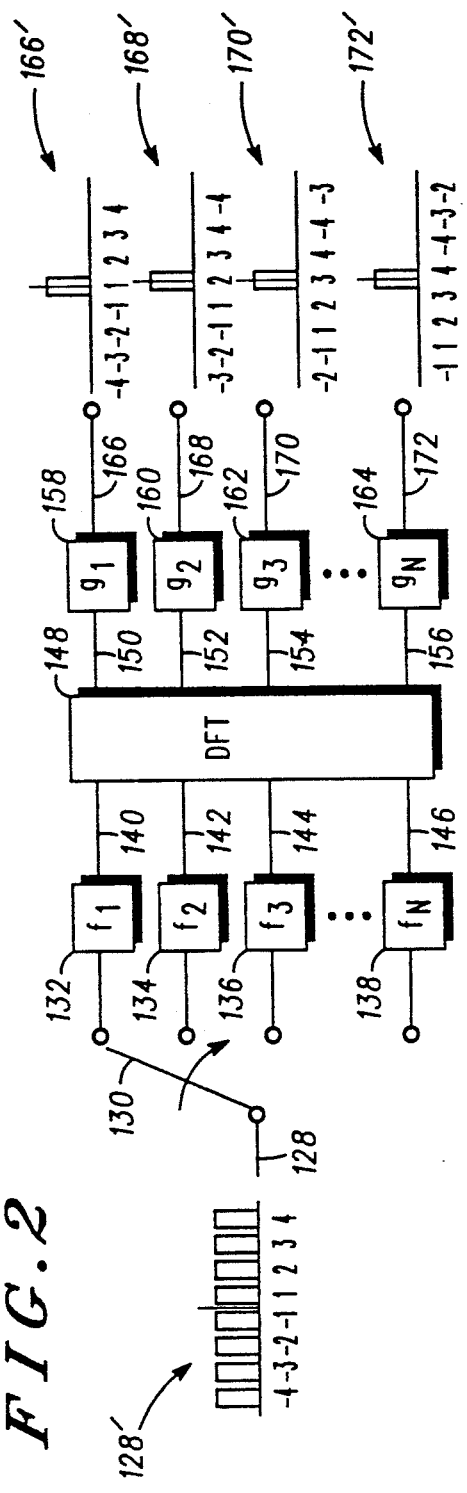
FIG. 2 is a block diagram showing a portion of the preferred embodiment receiver shown in FIG. 1.

The conditioned baseband electrical signal 124 preferably is operatively coupled to a digitizing device 126 (i.e., analog-to-digital (A/D) converter) which digitizes a portion of the baseband electrical signal 124 into a digitized signal 128. The digitized signal 128 represents the electromagnetic radiation within the intercepted frequency band. FIG. 2 shows a graphical representation 128' of this digitized signal 128 which contains a plurality of channels (i.e., N channels) contained in frequency divided passbands. The sampling rate of the digitizing device 126 preferably is set to be within the Nyquist criterion of at least twice the highest desired frequency with the baseband electrical signal 124.

Commutator 130 receives the digitized signal 128 and operatively couples portions of the digitized signal 128 to a discrete Fourier transform pre-filter bank including filters 132, 134, 136, and 138 (i.e., $f_1$, $f_2$, $f_3$, and $f_N$). For the purposes of the following description, four filters 132, 134, 136, and 138 are shown in FIG. 1; however, it will be appreciated by those skilled in the art that the principles described herein may be applied to more or less filters in the filter bank. The commutator 130 distributes portions of the digitized signal 128 to four filters 132, 134, 136, and 138 such that if commutator 130 is operating at a first sampling rate ($F_s$), then each of the N filters receives portions of the digitized signal 128 at a second sampling rate ($F_s/N$) where N is the number of filters to which the commutator 130 operatively couples the digitized signal 128 (as previously noted N also corresponds to the number of channels in the digitized signal 128).

Filters 132, 134, 136, and 138 attenuate undesired frequency components in the digitized signals (i.e., condition the digitized signals) so that the computational complexity of the subsequent discrete Fourier transform (DFT) operation may be reduced. These filters 132, 134, 136, and 138 operate similar to polyphase filters in known DFT pre-filter banks in that they receive their inputs from a commutator, and run in parallel to form the input to a discrete Fourier transformer. One such polyphase filter bank is shown and described in the previously cited related U.S. patent application Ser. No. 07/966,630 entitled "A Method and Means for Transmultiplexing Signals Between Signal Terminals and Radio Frequency Channels" which was filed on Oct. 22, 1992. However, as will be described in reference to FIGS. 2 and 3, the preferred embodiment receiver structure of the present patent application utilizes modified Cascaded Integrator Comb (CIC) filters 132, 134, 136, and 138 rather than polyphase filters. The outputs 140, 142, 144, and 146 of the respective filters 132, 134, 136, and 138 form the inputs to a discrete Fourier transformer 148.

Discrete Fourier transformer 148 preferably operates at the same or higher sampling rate of the filters 132, 134, 136, and 138. The discrete Fourier transformer 148 performs one transform (e.g., fast Fourier transform) per input block of samples 140, 142, 144, and 146 from the pre-filters 132, 134, 136, and 138. Each of the N outputs 150, 152, 154, and 156 of the discrete Fourier transformer 148 contains samples for one of the N different down converted channels. These N outputs 150, 152, 154, and 156 are generated by performing an N point Fourier transform which produces one output sample for each of the N channels. In the preferred embodiment receiver structure the fast Fourier transformer (FFT), operating at a rate higher than the sampling rate of the filters 132, 134, 136, and 138, (e.g., the FFT may operate at a rate which is three times greater than the filter sampling rate) are used to perform the operations of the discrete Fourier transformer 148. This high rate of operation for the FFT is required to avoid aliasing, because the modified CIC pre-filters used in the preferred embodiment receiver have a rolloff rate which is not as high as typical polyphase filter banks.

The use of FFTs allows the receiver structure to be implemented in a computationally efficient manner while providing for a means to reduce the effects of errors associated with discrete Fourier transforms. Some of these potential error sources in discrete Fourier transformers include: errors due to aliasing (i.e., errors resulting from overlapping of the decimated signal in the frequency domain), spectral distortion from leakage (i.e., spectral energy leaking from one frequency to another), and the picket-fence effect which results in important spectral components being missed (i.e., the discrete sampling omits particular spectral components of a signal which occurs between sample points). These sources of errors in the discrete Fourier transformers may be reduced through a variety of techniques in FFTs. For example, the errors due to aliasing may be reduced by increasing the sampling rate of the discrete Fourier transformer 148 and/or pre-filtering to minimize high-frequency spectral content of the inputs to the discrete Fourier transformer 148. Further, the spectral distortion due to leakage may be reduced by increasing the number of DFT points through operating at a higher sampling rate or increasing the window width using window functions that have Fourier transforms with low sidelobes, and/or eliminating large periodic components by filtering before performing window functions. Furthermore, the picket-fence effect may be reduced by increasing the number of DFT points while holding the sampling rate fixed such that the "pickets" are moved closer together and/or filling in additional DFT points with zeros (i.e., zero padding), if the data length is limited.

Because the discrete Fourier transformer 148 in the preferred embodiment receiver structure operates at a rate higher than the decimated sampling rate of the filters 132, 134, 136, and 138, N decimating post-filters 158, 160, 162, and 164 must be used to bring down the corresponding baseband response outputs 150, 152, 154, and 156 sampling rate to a desired sampling rate of N conditioned outputs 166, 168, 170, and 172, respectively (e.g., the post-filters bring down the sampling rate to typical voice or data sampling rates of less than 9600 bits/second). These N post-filters 158, 160, 162, and 164 (denoted $g_1$, $g_2$, $g_3$, and $g_n$) may be computationally simple (e.g., the filters may be Infinite Impulse Response (IIR) filters), if phase distortion is not critical. In addition, if recovery of only a subset of the N channels is desired (e.g., in lightly loaded communication systems), then these post-filters need only be implemented for that subset of desired channels. In the preferred embodiment receiver structure, the N decimating post-filters 158, 160, 162, and 164 preferably are designed with respect to at least one signal characteristic including: optimum selectivity, controlled phase response, and controlled amplitude response.

Finally, an information signal (e.g., voice and or data) may be detected within each of the N conditioned outputs 166, 168, 170, and 172. FIG. 2 shows a graphical representation 166', 168', 170', and 172' of these conditioned outputs 166, 168, 170, and 172. Each graphical representation shows one of the N channels as received from the plurality of channels contained in frequency divided passbands of the digitized signal 128. It will be appreciated by those skilled in the art that the information signal may be detected through the use of several decoding steps depending upon the particular signal coding and channelization standard to be received. For example, each conditioned output 166, 168, 170, and 172 may need to be convolutionally decoded, maximum likelihood sequence estimated, or vocoded to retrieve the voice or data present in the particular conditioned output.

Referring now more particularly to FIG. 2 and the pre-filters 132, 134, 136, and 138 ($f_1$, $f_2$, $f_3$, and $f_N$), the pre-filters 132, 134, 136, and 138 receive their inputs from a commutator 130 and operate in parallel to form the inputs 140, 142, 144, and 146, respectively, for the DFT filter bank 148. However, the preferred embodiment pre-filters 132, 134, 136, and 138 incorporate a bank of Hogenauer's Cascaded Integrator Comb (CIC) filters. This type of filter is generally described in an article by E. B. Hogenauer, "An Economical Class of Digital Filters for Decimation and Interpolation", *IEEE Trans. Acoust. Speech. Signal Processing*, vol. ASSP-20, No. 2, April, 1981, pp. 155-162. The CIC filters have advantages over typical polyphase filters in that CIC filters consist of cascaded first order integrators and combs (i.e., differencers), which allows these filters to be implemented without multipliers. In addition, since CIC filters include decimators, the multiply-accumulators (MACs) which are also in the pre-filters can be operated at a slower rate to further reduce the required computations. Thus, the pre-filters are more computationally efficient and, when implemented in a device, require less computational power, size, and execution time, than a typical polyphase filter.

However, since these principles, discussed by Hogenauer, related to CIC filters were not specifically designed to be used in the preferred embodiment multi-channel communication unit receiver structure, they must be modified. For simplicity, the following discussion is directed to a modified second order CIC filter. However, it will be appreciated by those skilled in the art that for the preferred embodiment receiver structure a modified fifth order CIC filter would provide a more optimal filter characteristic for this particular receiver structure.

If a mixer is used in conjunction with a modified CIC filter bank, then a down converter is formed. The second order down converter $y_2(MNT)$ can be described by the following equation:

$$y_2(MNT) = \sum_{j=0}^{M-1} \sum_{l=0}^{M-1} \sum_{k=0}^{N-1} \sum_{m=0}^{N-1} x(M[NT - k - m] - j - 1)\Phi(M[NT - k - m] - j - 1) \quad \text{(eq. 1)}$$

where:
- $\Phi(M[NT-k-m]-j-1)$ = the mixing sequence
- $x(M[NT-k-m]-j-1)$ = the input to the down converter
- M = the number of channel outputs to be input into the FFT
- N = the decimation rate of the modified CiC filter
- T = the time as referenced to the FFT's output
- k, m, j, and l = indices.

If the mixing sequence is periodic in M, then the sum may be separated from (eq. 1) as follows:

$$y_2(MNT) = \sum_{j=0}^{M-1} \sum_{l=0}^{M-1} \Phi(-j - 1) \sum_{k=0}^{N-1} \sum_{m=0}^{N-1} x(M[NT - k - m] - j - 1). \quad \text{(eq. 2)}$$

The expression in (eq. 2) can be simplified by rewriting it as follows:

$$y_2(MNT) = \sum_{j=0}^{M-1} \sum_{l=0}^{M-1} \Phi(-j - l)Z(MNT - j - l) \quad \text{(eq. 3)}$$

where:

$$Z(MNT - j - 1) = \sum_{k=0}^{N-1} \sum_{m=0}^{N-1} x(M[NT - k - m] - j - 1).$$

The expression in (eq. 3) now has two distinct operations of computing Z and computing $y_2$. Upon further examination of the Z operation, it should be noted that each Z operation is a modified second order CIC filter function operated at a particular phase (j+I) of a decimated version of the input x. These CIC filters preferably decimate by N. As a result, the computation of $y_2$ only involves computations based on the modified CIC filter outputs (Z). For further simplification, the expression in (eq. 3) can be rewritten to emphasize the dependence of the product term on (j+I) as follows:

$$y_2(MNT) = \sum_{j=0}^{M-1} \sum_{\Delta=j}^{M-1+j} \Phi(-\Delta)Z(MNT - \Delta). \quad \text{(eq. 4)}$$

The expression in (eq. 4) can be rewritten to eliminate one of the summation terms as follows:

$$y_2(MNT) = \sum_{j=0}^{M-1} \sum_{\Delta=j}^{M-1+j} \Phi(-\Delta)Z(MNT - \Delta) \quad \text{(eq. 5)}$$

$$= \sum_{j=0}^{M-1} \left[ \sum_{\Delta=0}^{M-1} \Phi(-\Delta)Z(MNT - \Delta) - \sum_{\Delta=0}^{j-1} \Phi(-\Delta)Z(MNT - \Delta) + \sum_{\Delta=M}^{M-1+j} \Phi(-\Delta)Z(MNT - \Delta) \right]$$

-continued $$= M \sum_{\Delta=0}^{M-1} \Phi(-\Delta)Z(MNT - \Delta) +$$

$$\sum_{\Delta=0}^{M-1} \left[ \sum_{\Delta=0}^{j-1} \Phi(-\Delta)Z(MNT - \Delta) + \sum_{\Delta=0}^{j-1} \Phi(-\Delta)Z(M[NT - 1] - \Delta) \right]$$

$$= M \sum_{\Delta=0}^{M-1} \Phi(-\Delta)Z(MNT - \Delta) +$$

$$\sum_{j=0}^{M-1} \left[ \sum_{\Delta=0}^{j-1} \Phi(-\Delta) \{Z(M[NT - 1] - \Delta) - Z(MNT - \Delta)\} \right]$$

$$= M \sum_{\Delta=0}^{M-1} \Phi(-\Delta)Z(MNT - \Delta) + Y(0) +$$

$$\sum_{\Delta=0}^{1} Y(\Delta) + \sum_{\Delta=0}^{2} Y(\Delta) + \ldots + \sum_{\Delta=0}^{M-2} Y(\Delta)$$

$$= M \sum_{\Delta=0}^{M-1} \Phi(-\Delta)Z(MNT - \Delta) + (M-1)Y(0) +$$

$$(M - 2)Y(1) + \ldots + Y(M - 2)$$

$$= M \sum_{\Delta=0}^{M-1} \Phi(-\Delta)Z(MNT - \Delta) +$$

$$\sum_{i=0}^{M-1} (M - i - 1)Y(i)$$

$$= M \sum_{\Delta=0}^{M-1} Z(MNT - \Delta) + \sum_{\Delta=0}^{M-1} (M - \Delta - 1)\Phi(-\Delta)\{Z(M[NT - 1] - \Delta) - Z(MNT - \Delta)\}$$

$$= \sum_{\Delta=0}^{M-1} \Phi(-\Delta) \{(\Delta + 1)Z(MNT - \Delta) + (M - \Delta - 1)Z(M[NT - 1] - \Delta).$$

If the mixing sequence is set to be equal to $\Phi(\Delta) = \exp(-j2\pi\Delta f/M)$, then (eq. 5) can be solved as an inverse discrete Fourier transform of the bracketed sum as follows:

$$y_2(MNT) = \sum_{\Delta=0}^{M-1} \exp(j2\pi\Delta f/M)w(MNT - \Delta) \quad \text{(eq. 6)}$$

where:

$$w(MNT - \Delta) = (\Delta + 1)Z(MNT - \Delta) + (M - \Delta - 1)Z(M[NT - 1] - \Delta)$$

$$j = \sqrt{-1}.$$

As previously noted, the modified second order CIC filter expression derived above which resulted in (eq. 6) does not have an optimal filter characteristic. Stated differently, the modified second order CIC filter will not provide enough selectivity for the preferred embodiment 32 channel NAMPS receiver as shown in FIGS. 1 and 2. For this preferred embodiment an eighty decibel (80 dB) stop band is required in the modified CIC filter. This can be accomplished with a modified fifth order CIC filter which is substantially similar to the modified second order CIC filter described above. A pth channel output of the modified fifth order CIC filter $y_5^f(MNT)$ can be described as follows:

$$y_f(MNT) = \sum_{\Delta=0}^{M-1} \exp(-j2\pi\Delta f/M) w(MNT + \Delta)$$

where:

$$w(MNT + \Delta) = \sum_{k=0}^{4} a_k(\Delta) Z(M[NT - k] + \Delta)$$

and where:

$$Z(M[NT - k] + \Delta) =$$

$$\sum_{k_0=0}^{N-1} \sum_{k_1=0}^{N-1} \sum_{k_2=0}^{N-1} \sum_{k_3=0}^{N-1} \sum_{k_4=0}^{N-1} [x (M [NT - k_0 - k_1 - k_2 - k_3 - k_4] + \Delta)]$$

$a_k(\Delta) = A(kM - \Delta)$

M = the number of channel outputs to be input into the FFT

N = the decimation rate of the modified CIC filter

T = the time as referenced to the FFT's output. (eq. 7)

It will be appreciated by those skilled in the art that the sign of the $\Delta$ has been changed in (eq. 7) from the sign in (eq. 6). This allows a DFT (instead of a IDFT) to be used in the preferred embodiment receiver structure. In addition, A(k) preferably is an impulse response of a 5th order CIC filter (not modified CIC) with a decimation rate M. This impulse response may be found in a variety of ways. One way is to use FFTs. Since the impulse response of a 1st order CIC filter with a decimation rate M is a unit step of length M, the response of the 5th order CIC filter is just the convolution of five of these unit steps together. This convolution may be computed using the inverse FFT of the FFT of a unit step of length M padded by 4(M−1)+1 zeroes, raised to the 5th power. It should be noted by those skilled in the art that this A(k) is only one of many A(k) sets of coefficients which may serve as combiner coefficients for the CIC outputs. Other coefficients may be generated which produce other desirable frequency responses.

Figure 3:
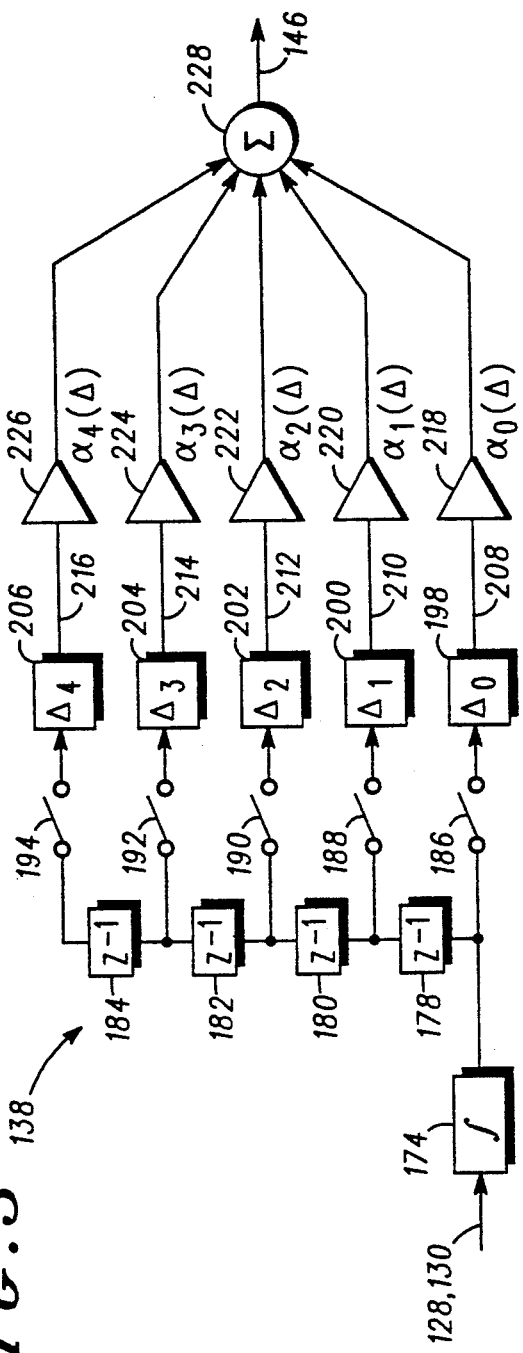
FIG. 3 is a block diagram showing a preferred embodiment filter in accordance with the present invention for use in the preferred embodiment receiver shown in FIGS. 1 and 2.

The modified fifth order CIC filter expression of (eq. 7) may be implemented in a variety of different means. However, a preferred embodiment fifth order modified CIC filter design is shown in FIG. 3. The fifth order filter design is used to implement each of the parallel modified CIC filters 132, 134, 136, and 138 (i.e., $f_1$, $f_2$, $f_3$, and $f_N$) as shown in FIG. 2 and previously described. By way of example, the modified fifth order CIC filter shown in FIG. 3 will be described as modified CIC filter 138 ($f_N$); however, each of the modified CIC filters 132, 134, 136, and 138 (i.e., $f_1$, $f_2$, $f_3$, and $f_N$) in the preferred embodiment communication unit receiver preferably implements a substantially similar modified CIC filter design.

The preferred embodiment modified CIC filter 138 receives a portion of the digitized signal 128 at an input. The portion of the digitized signal received by modified CIC filter 138 is determined by commutator 130 which operatively couples portions of the digitized signal 128 to each of the modified CIC filters 132, 134, 136, and 138 (i.e. $f_1$, $f_2$, $f_3$, and $f_N$). This digitized signal portion 128/130 is input to a fifth order integrator 174 which integrates bits received within the digitized signal portion 128/130 over an infinite time period to produce part of $Z(M[NT] - \Delta)$ of (eq. 7).

A preferred embodiment fifth order integrator 174 is shown in FIG. 7 which consists of five cascaded 1st order integrators. Signal portion 128/130 is provided to a summer 701 which adds the output of delay element 702 to signal portion 128/130. The summer output 703 is then provided to the next integrator stage, consisting of summer 704 and delay element 705, which adds the output of delay element 705 to with summer output 703 to produce summer output 706. This integration operation is repeated three more times utilizing summers 707, 710, and 713 as well as delay element 708, 711, and 714. The result of this fifth order integration process is integrator 174 result 176.

The fifth order integrator 174 result 176 is output to fifth order differencers 198, 200, 202, 204, and 206 ($\Delta_0$, $\Delta_1$, $\Delta_2$, $\Delta_3$, and $\Delta_4$) through delay elements 178, 180, 182, and 184. More precisely, the integrator 174 result 176 (i.e., integrator output) is input to differencer 198 after being decimated to a lower sample rate (e.g., one seventh of the sample of the integrator 174 result 176) by a decimating device 186. It will be appreciated by those skilled in the art that this decimation of result 176 allows the subsequent parts of (eq. 7) to be implemented within pre-filter 138 in a less computationally complex manner, than would otherwise be required if the result 176 was not decimated. The differencer 198 implements part of the function within (eq. 7) and computes $Z(M[NT-k] - \Delta)$ when $k = 0$).

By way of example differencer 198 is shown in FIG. 8 consisting of five cascaded 1st order differencers. The output of decimator 186 is provided to summer 801 which subtracts the output of delay element 802 from the output of decimator 186. The summer output 803 is then provided to the next differencer stage, consisting of summer 804 and delay element 805, which subtracts the output of delay 805 from summer output 803 to produce summer output 806. This differencing operation is repeated three more times utilizing summers 807, 810, and 813 as well as delay elements 808, 811, and 814 to produce the fifth order differencer 198 output 208. It will be appreciated by those skilled in the art that each of the other fifth order differencers 200, 202, 204, and 206 may be implemented in a manner similar to that which has been described in reference to FIG. 8 for differencer 198.

Subsequently, the output 208 of differencer 198 (i.e., the function $Z(M[NT] - \Delta)$ is scaled by a factor $a_0$ with multiplier 218. Similarly, the integrator 174 result 176 is input to differencer 200 after being delayed for one sample time by delay element 178 and subsequently decimated to a lower sample rate by a decimating device 188. The output 210 of differencer 200, which is the result of the function $Z(M[NT-k] - \Delta)$ when $k=1$, is scaled by a factor $a_1$ with multiplier 220. Further, a delayed and decimated version of result 176 is input to differencer 202 after being delayed for two sample times by delay elements 178 and 180 and decimated by a decimating device 190. The output 212 of differencer 202 (i.e., the result of $Z(M[NT-k] - \Delta)$ when $k=2$) is scaled by a factor $a_2$ with multiplier 222. Furthermore, a delayed and decimated version of result 176 is input to differencer 204 after being delayed for three sample times by delay elements 178, 180, and 182 and decimated by a decimating device 192. The output 214 of differencer 204 (i.e., the result of $Z(M[NT-k] - \Delta)$ when $k=3$) is scaled by a factor $a_3$ with multiplier 224. Finally, a delayed and decimated version of result 176 is input to differencer 206 after being delayed for four sample times by delay elements 178, 180, 182, and 184 and decimated by a decimating device 194. The output 216 of differencer 206 (i.e., the result of $Z(M[NT-k]-\Delta)$ when k=4) is scaled by a factor $a_4$ with multiplier 226. It will be appreciated by those skilled in the art that the decimating and delay functions performed by elements 178, 180, 182, 184, 186, 188, 190, 192, and 194 alternatively may be implemented as a single decimating device coupled to integrator 174 result 176 followed by four delay elements without departing from the scope and spirit of the present invention.

The scaled differencer outputs from multipliers 218, 220, 222, 224, and 226 preferably are then summed together by summer 228 such that the scaled differencer outputs based on the present sample plus four previous samples are summed together (i.e., a fifth order summation). Finally, the result from summer 228 is provided as the output 146 of the fifth order pre-filter 138.

Figure 4:
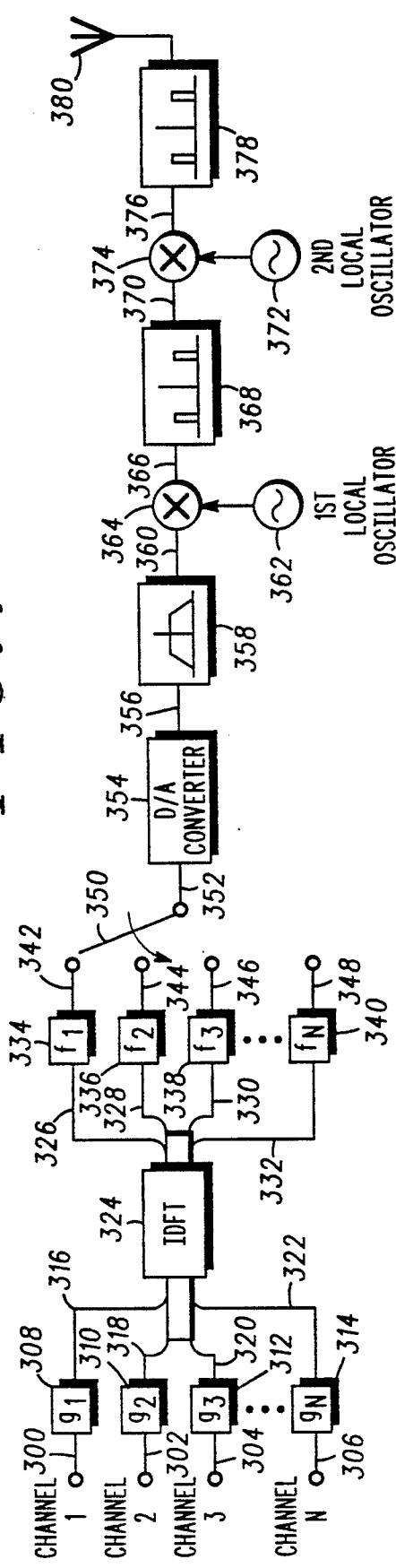
FIG. 4 is a block diagram showing a preferred embodiment transmitter in accordance with the present invention.

The principles described above in reference to a preferred embodiment receiver, as shown in FIGS. 1–3, may also be applied to a preferred embodiment transmitter in accordance with the present invention, as shown in FIGS. 4–6. By way of example, like the preceding description of the preferred embodiment receiver, the following description of the preferred embodiment transmitter refers to four channels (i.e., channels 1, 2, 3, and N). However, as will be appreciated by those skilled in the art the principles described herein may be readily applied to more or less transmitter channels without departing from the scope and spirit of the present invention.

As shown in FIG. 4 N inputs 300, 302, 304, and 306 (i.e., N digitized channels or N digitized information signals 300', 302', 304', and 306' as shown in graphical form in FIG. 5) may be input to pre-filters 308, 310, 312, and 314, respectively (i.e., pre-filters $g_1$, $g_2$, $g_3$, and $g_N$). These pre-filters 308, 310, 312, and 314 perform baseband filtering (i.e., condition) N inputs 300, 302, 304, and 306 with respect to at least one signal characteristic including: optimum selectivity, controlled phase response, and controlled amplitude response. In addition, the pre-filters 308, 310, 312, and 314 interpolate the N inputs 300, 302, 304, and 306 to increase the sampling rate such that a subsequent inverse discrete Fourier transformer 324 can operate at a rate higher than that of the N inputs 300, 302, 304, and 306 (e.g., the FFTs may operate at a rate which is three times greater than the filter sampling rate). This interpolation may be accomplished by zero-padding the N inputs 300, 302, 304, and 306 (e.g. inserting two zero value samples between each sample of the inputs). The pre-filters 308, 310, 312, and 314, like the receiver post-filters 158, 160, 162, and 164, preferably are computationally simple to implement. As such, IIR filters may be used, if phase distortion is not critical. In the preferred embodiment transmitter structure, the N interpolating pre-filters 308, 310, 312, and 314 preferably are designed with respect to at least one signal characteristic including: optimum selectivity, controlled phase response, and controlled amplitude response. The N outputs 316, 318, 320, and 322 of the pre-filters 308, 310, 312, and 314 preferably are provided to an inverse discrete Fourier transformer 324 which performs an N point inverse Fourier transform (e.g., inverse fast Fourier transform) per input block of pre-filtered samples 316, 318, 320, and 322. Each of the N outputs 326, 328, 330, and 332 of the inverse discrete Fourier transformer 324 contains samples for one of the N different up converted frequency components.

These N outputs 326, 328, 330, and 332 are post-filtered by filters 334, 336, 338, and 340 (i.e., post-filters $f_1$, $f_2$, $f_3$, and $f_N$). These post filters operate similar to polyphase filters in known inverse discrete Fourier transform post-filter banks in that they receive their inputs from an inverse discrete Fourier transformer, and run in parallel to form the input to a commutator 350. One such polyphase filter bank is shown and described in the previously cited related U.S. patent application Ser. No. 07/966,630 entitled "A Method and Means for Transmultiplexing Signals Between Signal Terminals and Radio Frequency Channels" which was filed on Oct. 22, 1992. However, as will be described in reference to FIGS. 5 and 6, the preferred embodiment transmitter of the present patent application utilizes modified Cascaded Integrator Comb (CIC) filters 334, 336, 338, and 340 rather than polyphase filters.

These modified CIC post-filters 334, 336, 338, and 340 implement a fifth order function $X(M[NT-k]+\Delta)$ similar to (eq. 7) as described below:

$$X(M(NT-k]+\Delta) = \sum_{k=0}^{4} a_k(\Delta)Z^\Delta(NT-k)$$

where:
M = the number of IFFT outputs
$a_k(\Delta) = A(kM-\Delta)$ $$Z^\Delta(NT-k) =$$

$$\sum_{k_0=0}^{N-1}\sum_{k_1=0}^{N-1}\sum_{k_2=0}^{N-1}\sum_{k_3=0}^{N-1}\sum_{k_4=0}^{N-1}[\tilde{w}^\Delta x \,(NT-$$

$$k-k_0-k_1-k_2-k_3-k_4)]$$

$$\tilde{w}^\Delta(NT-k) = \begin{cases} w^\Delta(T); & k=0 \\ 0; & k \neq 0 \end{cases} = \text{the upsampled } w^\Delta(T)$$

$$w^\Delta(T) = \sum_{f=0}^{M-1} \exp(j2\pi\Delta f/M)y_s^f(T) \qquad \text{(eq. 8)}$$

In (eq. 8), $X(M[NT-k]+\Delta)$ is the output of the transmitter, where the $\Delta$'s are an offset in time. Thus, each branch of the inverse FFT corresponds to a different time offset, which means that a commutator can recover the output sequence from the processed inverse FFT branches. In addition, A(k) preferably is the same as was previously described for the preferred embodiment receiver. However, as will be appreciated by those skilled in the art that this A(k) may be modified to change the transmitter's filter response to meet design specifications for the transmitter which differ from the receiver design specifications.

The modified fifth order CIC filter expression of (eq. 8) may be implemented in a variety of different means. However, a preferred embodiment fifth order modified CIC filter design is shown in FIG. 6. The fifth order filter design is used to implement each of the parallel modified CIC post-filters 334, 336, 338, and 340 (i.e., $f_1$, $f_2$, $f_3$, and $f_N$) as shown in FIG. 5 and previously described. By way of example, the modified fifth order CIC filter shown in FIG. 6 will be described as modified CIC filter 340 ($f_N$); however, each of the modified CIC filters 334, 336, 338, and 340 (i.e., $f_1$, $f_2$, $f_3$, and $f_N$) in the preferred embodiment communication unit receiver preferably implements a substantially similar modified CIC filter design.

The preferred embodiment modified CIC filter 340 receives the Nth output 332 of inverse discrete Fourier transformer 324 at an input. This Nth output 332 is input to a fifth order differencer 354 ($\Delta$). The differencer 198 implements part of the function within (eq. 8). The preferred embodiment fifth order differencer 354 was previously described in reference to FIG. 8.

Subsequently, the differencer 354 result 356 (i.e., differencer output) preferably is input to a fifth order integrator 362 after being upconverted to a higher sample rate (e.g., seven times the sample rate of the differencer 354 result 356) by an interpolating device 358. It will be appreciated by those skilled in the art that this interpolation of result 356 allows the subsequent parts of (eq. 8) to be implemented within post-filter 340 at a higher sampling rate such that the individual transmit channels can be further separated (i.e., separated by one or more transmit channels).

The fifth order integrator 362 which integrates bits within the interpolated differencer result 360 over an infinite time period to produce $Z^\Delta(NT-k)$ of (eq. 8). The preferred embodiment fifth order integrator 362 was previously described in reference to FIG. 7.

Subsequently, the output 364 of integrator 362 is scaled by a factor $a_0$ with multiplier 374. Similarly, the integrator 362 result 364 is scaled by a factor $a_1$ with multiplier 376 after being delayed for one sample time by delay element 366. Further, a delayed version of result 364 is scaled by a factor $a_2$ with multiplier 378 after being delayed for two sample times by delay elements 366 and 368. Furthermore, a delayed version of result 364 is scaled by a factor $a_3$ with multiplier 380 after being delayed for three sample times by delay elements 366, 368, and 370. Finally, a delayed version of result 364 is scaled by a factor $a_4$ with multiplier 382 after being delayed for four sample times by delay elements 366, 368, 370, and 372.

The scaled integrator outputs from multipliers 374, 376, 378, 380, and 382 preferably are then summed together by summer 384 such that the scaled integrator outputs based on the present sample plus four previous samples are summed together (i.e., a fifth order summation). Finally, the result from summer 348 is provided as the output of the post-filter 340.

It will be appreciated by those skilled in the art that the integrating, delay, scaling, and summing functions performed by elements 362, 366, 368, 370, 372, 374, 376, 378, 380, 382, and 384 alternatively may be implemented by moving the integrator 362 to follow the summer 384 without departing from the scope and spirit of the present invention.

The outputs 342, 344, 346, and 348 (i.e., post-conditioned digitized information signals 342, 344, 346, and 348) of the respective modified CIC post-filters 334, 336, 338, and 340 form the inputs to a commutator 350. Commutator 350 operatively couples the modified CIC post-filter outputs 342, 344, 346, and 348 to a digital-to-analog (D/A) converter 354 through commutator 350 output 352. The commutator 350 commutates portions of each of the post-conditioned digitized information signals 342, 344, 346, and 348 together to form a composite digitized information signal 352' (shown in graphical form in FIG. 5) which is output on commutator 350 output 352.

The composite digitized information signal 352' is converted by the digital-to-analog (D/A) converter 354 into a composite analog transmission signal 356 (i.e., a baseband electrical signal 356). Subsequently, the baseband electrical signal 356 is filtered by a low pass filter 358 to eliminate undesired frequency components into a conditioned baseband electrical signal 360.

The conditioned baseband electrical signal 360 is input to an up converter. This up converter consists of a mixer 364, a frequency agile local oscillator 362, and a band pass filter 368. The conditioned baseband electrical signal 360 is operatively coupled to one input of the mixer 364 and the output of the oscillator 362 is provided to another input of mixer 364. Mixer 364 mixes the baseband electrical signal 360 up to an IF band electrical signal 366. Subsequently, the IF band electrical signal 366 is filtered by a band pass filter 368 to eliminate undesired frequency components into a conditioned IF band electrical signal 370.

The conditioned IF band electrical signal 370 is input to another up converter. The up converter consists of a mixer 374, a frequency agile local oscillator 372, and a band pass filter 378. The electrical signal 370 is operatively coupled to one input of the mixer 374 and the output of the oscillator 372 is provided to another input of mixer 374. Mixer 374 mixes the IF band electrical signal 370 up to a radio frequency (RF) band electrical signal 376. Subsequently, the RF band electrical signal 376 is filtered by a band pass filter 378 to eliminate undesired frequency components into a conditioned RF band electrical signal.

Finally, the conditioned RF band electrical signal preferably is output by a device such as antenna 380 which amplifies and radiates the conditioned RF band electrical signal as electromagnetic radiation within the frequency band of interest. It will be appreciated by those skilled in the art that other types of output devices may be used for transmitting or radiating electromagnetic radiation. For example a wave guide, a coaxial cable, an optical fiber, or an infrared frequency transducer may be used to transmit electromagnetic radiation.

The present invention may alternatively be described in reference to FIGS. 1-6 as follows. Referring now to FIG. 1, a communication receiving unit is shown. The communication receiving unit preferably includes a frequency selector mechanism 102, 106, 108, 112, 116, 118, and 122 for intercepting and selecting a portion of an input frequency band. The frequency selector preferably includes a transducer (not shown) which converts an input frequency band (e.g. received by an antenna 100) to an electrical signal. This electrical signal is subsequently provided to an input of a filter 102 that selects a portion of an electrical signal 104 which represents intercepted electromagnetic radiation within a particular portion of the input frequency band. In addition, this electrical signal 104 (i.e., which represents the intercepted electromagnetic radiation within a particular portion of the frequency band) may be frequency translated to a different frequency band (e.g., an intermediate frequency (IF) band 110 or baseband frequency 120) to facilitate signal processing of the electrical signal. This frequency translation may be accomplished through a one, two, or more stage process. For example, the two stage process consists of a first stage in which the selected portion 104 of the electrical signal is input to one input of a mixer 106 and the output of a local oscillator 108 (set at a predetermined IF frequency) is provided to another input of the mixer 106. The output of the mixer 106 is a down converted electrical signal 110 having frequency components predominately near the predetermined frequency of the local oscillator 108. This electrical signal 110 may be conditioned to remove undesired frequency components by a bandpass filter 112. The filter 112 output (i.e., the conditioned IF band electrical signal 112) may then be input to a second stage.

In the second stage, the electrical signal 114 is down converted by a mixer 118 in conjunction with a local oscillator 116 and subsequently conditioned by a lowpass filter 122 to produce a baseband electrical signal 124. This baseband electrical signal 124 is then operatively coupled to an analog-to-digital converter 126 which digitizes the baseband electrical signal 124 (that represents the selected portion of an input frequency band). Next, a commutator 130, operatively coupled to the analog-to-digital converter 126, subdivides the digitized portion 128 of the input frequency band into the plurality of digitized signal portions.

A discrete Fourier transformer 148, operatively coupled to the commutator 130, generates a plurality of digitized channel signals 166, 168, 170, and 172 by discrete Fourier transforming the plurality of digitized signal portions. The discrete Fourier transformer 148 preferably includes signal conditioners 132, 134, 136, and 138 for pre-conditioning the plurality of digitized signal portions prior to the plurality of digitized signal portions being discrete Fourier transformed into the plurality of digitized channel signals 166, 168, 170, and 172. The signal conditioners 132, 134, 136, and 138 may be modified cascaded integrator comb (CIC) filters or polyphase filters as described above. The pre-conditioning performed by the signal conditioners 132, 134, 136, and 138 preferably consists of filtering each digitized signal portion with respect to a signal characteristic (e.g., optimum selectivity, controlled phase response, or controlled amplitude response).

Finally, detectors, operatively coupled to the discrete Fourier transformer 148, detect at least two information signals from the plurality of digitized channel signals 166, 168, 170, and 172. Each information signal preferably conforms with a signal coding and channelization standard such as frequency division multiple access, time division multiple access, or frequency hopping code division multiple access.

Referring now to FIG. 4, a communication transmitting unit is shown. The communication transmitting unit preferably includes an inverse discrete Fourier transformer 324 for generating a plurality of digitized signals 342, 344, 346, and 348 by inverse discrete Fourier transforming a plurality of input digitized information signals 300, 302, 304, and 306. Each information signal preferably conforms with a signal coding and channelization standard such as frequency division multiple access, time division multiple access, or frequency hopping code division multiple access. The inverse discrete Fourier transformer 324 preferably includes signal conditioners 334, 336, 338, and 340 for post-conditioning the plurality of digitized signals 342, 344, 346, and 348 after the plurality of input digitized information signals 300, 302, 304, and 306 have been inverse discrete Fourier transformed into the plurality of digitized signals 342, 344, 346, and 348. The signal conditioners 334, 336, 338, and 340 may be modified cascaded integrator comb (CIC) filters or polyphase filters as described above. The post-conditioning performed by the signal conditioners 334, 336, 338, and 340 preferably consists of filtering each digitized signal with respect to a signal characteristic (e.g., optimum selectivity, controlled phase response, or controlled amplitude response).

A commutator 350, operatively coupled to the inverse discrete Fourier transformer 324, combines portions of the plurality of digitized signals 342, 344, 346, and 348 into a composite digitized signal 352. An analog-to-digital converter 354, operatively coupled to the commutator 350, generates a composite analog transmission signal 356 from the composite digitized signal 352.

The communication transmitting unit preferably includes a frequency selector mechanism 358, 362, 364, 368, 372, 374, and 378, operatively coupled to the analog-to-digital converter 354, for selecting a portion of a frequency band that the composite analog transmission signal 356 is to be transmitted. The composite analog transmission signal 356 preferably is provided to an input of a filter 358 that selects the portion 360 of the composite analog transmission signal 356 which is to be transmitted. This selected portion 360 of composite analog transmission signal 356 may be frequency translated to a different frequency band (e.g., an intermediate frequency (IF) band 366 or a radio frequency (RF) band 376) to facilitate transmission. This frequency translation may be accomplished through a one, two, or more stage process. For example, the two stage process consists of a first stage in which the selected portion 360 is input to one input of a mixer 364 and the output of a local oscillator 362 (set at a predetermined IF frequency) is provided to another input of the mixer 364. The output of the mixer 364 is an up converted composite analog transmission signal 366 having frequency components predominately near the predetermined frequency of the local oscillator 362. This composite analog transmission signal 366 may be conditioned to remove undesired frequency components by a bandpass filter 368. The filter 368 output (i.e., the conditioned IF band analog transmission signal 370) may then be input to a second stage. In the second stage, the analog transmission signal 370 is up converted by a mixer 374 in conjunction with a local oscillator 372 and subsequently conditioned by a bandpass filter 378 to produce an RF band analog transmission signal. Finally, a transmitting mechanism 380, operatively coupled to the frequency selector mechanism 358, 362, 364, 368, 372, 374, and 378, transmits the RF band analog transmission signal over a frequency band.

Although the invention has been described and illustrated with a certain degree of particularity, it is understood that the present disclosure of embodiments has been made by way of example only and that numerous changes in the arrangement and combination of parts as well as steps may be resorted to by those skilled in the art without departing from the spirit and scope of the invention as claimed.

What is claimed is:

1. A filter comprising a plurality of conditioning means for conditioning a digitized signal during digital signal processing, each conditioning means comprising an integrator, at least one differencer, and at least one multiplier operatively coupled together to condition a portion of the digitized signal.

2. The filter of claim 1 wherein:

(a) the at least one differencer of each conditioning means comprises a first and a second differencer, each operatively coupled to an output of the integrator, the second differencer being operatively coupled through a delay element;
(b) the at least one multiplier of each conditioning means comprises a first and a second multiplier, operatively coupled to the first and the second differencer, respectively, for generating scaled outputs of the first and the second differencer; and
(c) each conditioning means further comprises a summing means, operatively coupled to the first and the second multiplier, for generating a portion of the conditioned digitized signal from the scaled outputs of the first and the second multiplier.

3. The filter of claim 2 wherein:
(a) each conditioning means further comprises:
 (i) a third differencer operatively coupled to an output of the integrator through at least two delay elements; and
 (ii) a third multiplier, operatively coupled to the third differencer, for generating a scaled output of the third differencer; and
(b) the summing means is further operatively coupled to the third multiplier, for generating the portion of the conditioned digitized signal from the scaled output of the third multiplier.

4. The filter of claim 1 wherein:
(a) the integrator of each conditioning means is operatively coupled to an output of the differencer of each conditioning means;
(b) the at least one multiplier of each conditioning means comprises a first and a second multiplier, operatively coupled to the integrator, for generating scaled outputs of the integrator, the second multiplier being operatively coupled through a delay element; and
(c) each conditioning means further comprises a summing means, operatively coupled to the first and the second multiplier, for generating a portion of the conditioned digitized signal from the scaled outputs of the first and the second multiplier.

5. The filter of claim 4 wherein:
(a) each conditioning means further comprises a third multiplier, operatively coupled to an output of the integrator through at least two delay elements, for generating a scaled output of the integrator; and
(b) the summing means is further operatively coupled to the third multiplier, for generating the portion of the conditioned digitized signal from the scaled output of the third multiplier.

6. A filter comprising a plurality of pre-conditioning means for pre-conditioning a digitized signal for subsequent digital signal processing, each pre-conditioning means comprising:
(a) an integrator;
(b) a first and a second differencer, each operatively coupled to an output of the integrator, the second differencer being operatively coupled through a delay element;
(c) a first and a second multiplier, operatively coupled to the first and the second differencer, respectively, for generating a scaled output of the first and the second differencer; and
(d) a summing means, operatively coupled to the first and the second multiplier, for generating a portion of the pre-conditioned digitized signal from the scaled outputs of the first and the second multiplier.

7. The filter of claim 6 further comprising a first and a second decimating means, operatively coupled to the first and the second differencer, respectively, for reducing a sample rate of the integrator input to the first and the second differencer.

8. The filter of claim 6 wherein:
(a) each pre-conditioning means further comprises:
 (i) a third differencer operatively coupled to an output of the integrator through at least two delay elements; and
 (ii) a third multiplier, operatively coupled to the third differencer, for generating a scaled output of the third differencer; and
(b) the summing means is further operatively coupled to the third multiplier, for generating the portion of the pre-conditioned digitized signal from the scaled output of the third multiplier.

9. A filter comprising a plurality of post-conditioning means for post-conditioning a digitized signal after digital signal processing, each post-conditioning means comprising:
(a) a differencer;
(b) an integrator operatively coupled to an output of the differencer;
(c) a first and a second multiplier, operatively coupled to the integrator, for generating a scaled output of the integrator, the second multiplier being operatively coupled through a delay element; and
(d) a summing means, operatively coupled to the first and the second multiplier, for generating a portion of the post-conditioned digitized signal from the scaled outputs of the first and the second multiplier.

10. The filter of claim 9 further comprising an upsampling means, operatively coupled to the differencer, for increasing a sample rate of the output of the differencer input to the integrator.

11. The filter of claim 9 wherein:
(a) each post-conditioning means further comprises a third multiplier, operatively coupled to an output of the integrator through at least two delay elements, for generating a scaled output of the integrator; and
(b) the summing means is further operatively coupled to the third multiplier, for generating the portion of the post-conditioned digitized signal from the scaled output of the third multiplier.

12. A filter comprising a plurality of pre-conditioning means for pre-conditioning a digitized signal for subsequent digital signal processing, each pre-conditioning means comprising:
(a) an integrator of at least order one;
(b) a first, a second, and a third differencer, each operatively coupled to an output of the integrator, each of at least order one, the second differencer being operatively coupled through a delay element, the third differencer being operatively coupled through at least two delay elements;
(c) a first, a second, and a third multiplier, operatively coupled to the first, the second, and the third differencer, respectively, for generating scaled outputs of each differencer, respectively; and
(d) a summing means, operatively coupled to the each of the multipliers, for generating a portion of the pre-conditioned digitized signal from the scaled outputs of the multipliers.

13. A filter comprising a plurality of post-conditioning means for post-conditioning a digitized signal after digital signal processing, each post-conditioning means comprising:
   (a) a differencer of at least order one;
   (b) an integrator of at least order one operatively coupled to an output of the differencer;
   (c) a first, a second, and a third multiplier, operatively coupled to the integrator, for generating scaled outputs of the integrator, the second multiplier being operatively coupled through a delay element, the third multiplier being operatively coupled through at least two delay elements; and
   (d) a summing means, operatively coupled to each of the multipliers, for generating a portion of the post-conditioned digitized signal from the scaled outputs of the multipliers.

14. A communication receiving unit, comprising:
   (a) a plurality of filtering means for pre-conditioning a digitized signal for subsequent Fourier transformation each filtering means comprising an integrator, at least one differencer, and at least one multiplier operatively coupled together to pre-condition a portion of the digitized signal; and
   (b) Fourier transforming means, operatively coupled to the plurality of filtering means, for generating a digitized channel signal.

15. The communication unit of claim 14 wherein each filtering means further comprises:
   (a) the at least one differencer of each filtering means comprises a first and a second differencer, each operatively coupled to an output of the integrator, the second differencer being operatively coupled through a delay element;
   (b) the at least one multiplier of each filtering means comprises a first and a second multiplier, operatively coupled to the first and the second differencer, respectively, for generating scaled outputs of the first and the second differencer; and
   (c) each filtering means further comprises a summing means, operatively coupled to the first and the second multiplier, for generating a portion of the pre-conditioned digitized signal from the scaled outputs of the first and the second multiplier.

16. The communication unit of claim 15 wherein each filtering means further comprises a first and a second decimating means, operatively coupled to the first and the second differencer, respectively, for reducing a sample rate of the output of the integrator input to the first and the second differencer.

17. The communication unit of claim 15 wherein:
   (a) each filtering means further comprises:
      (i) a third differencer operatively coupled to an output of the integrator through at least two delay elements; and
      (ii) a third multiplier, operatively coupled to the third differencer, for generating a scaled output of the third differencer; and
   (b) the summing means is further operatively coupled to the third multiplier, for generating the portion of the pre-conditioned digitized signal from the scaled output of the third multiplier.

18. The communication unit of claim 14 further comprising:
   (a) input means for intercepting electromagnetic radiation within a frequency band; and
   (b) digitizing means, operatively coupled to the input means, for digitizing a portion of the intercepted electromagnetic radiation into the digitized signal.

19. The communication unit of claim 18 wherein the digitizing means comprises:
   (a) a frequency selection means for selecting a portion of the intercepted electromagnetic radiation; and
   (b) an analog-to-digital conversion means, operatively coupled to the frequency selection means, for digitizing the selected intercepted electromagnetic radiation portion into a digitized signal.

20. The communication unit of claim 19 wherein the frequency selection means comprises a frequency translator operatively coupled to a filter that selects intercepted electromagnetic radiation within a particular portion of the frequency band.

21. The communication unit of claim 20 wherein the frequency translator comprises means for shifting the selected intercepted electromagnetic radiation portion to a predetermined intermediate frequency.

22. The communication unit of claim 14 further comprising conditioning means, operatively coupled to the Fourier transforming means, for removing undesired signals from the digitized channel signal.

23. The communication unit of claim 22 wherein the conditioning means comprises means for filtering the digitized channel signal with respect to a signal characteristic selected from the group consisting of optimum selectivity, controlled phase response, and controlled amplitude response.

24. The communication unit of claim 14 further comprising a detecting means, operatively coupled to the Fourier transforming means, for detecting an information signal within the digitized channel signal.

25. A communication transmitting unit, comprising:
   (a) inverse Fourier transforming means for generating a composite digitized signal from a plurality of digitized information signals to be transmitted; and
   (b) a plurality of filtering means, operatively coupled to the inverse Fourier transforming means, for post-conditioning the composite digitized signal for subsequent transmission, each filtering means comprising an integrator, a differencer, and at least one multiplier operatively coupled together to post-condition a portion of the digitized signal.

26. The communication unit of claim 25 wherein:
   (a) the integrator of each filtering means is operatively coupled to an output of the differencer of each filtering means:
   (b) the at least one multiplier of each filtering means comprises a first and a second multiplier, operatively coupled to the integrator, for generating scaled outputs of the integrator, the second multiplier being operatively coupled through a delay element; and
   (c) each filtering means further comprises a summing means, operatively coupled to the first and the second multiplier, for generating a portion of the post-conditioned digitized signal from the scaled outputs of the first and the second multiplier.

27. The communication unit of claim 26 wherein each filtering means further comprises an upsampler, operatively coupled to the differencer, for increasing a sample rate of the output of the differencer input to the integrator.

28. The communication unit of claim 26 wherein:
   (a) each filtering means further comprises a third multiplier, operatively coupled to an output of the integrator through at least two delay elements, for generating a scaled output of the integrator; and (b) the summing means is further operatively coupled to the third multiplier, for generating the portion of the conditioned digitized signal from the scaled output of the third multiplier.

29. The communication unit of claim 25 further comprising an input means, operatively coupled to the inverse Fourier transforming means, for receiving the plurality of digitized information signals to be transmitted and subsequently providing the plurality of digitized information signals to the inverse Fourier transforming means.

30. The communication unit of claim 25 further comprising a conditioning means, operatively coupled to the inverse Fourier transforming means, for removing undesired signals from the plurality of digitized information signals prior to the generation of the composite digitized signal.

31. The communication unit of claim 30 wherein the conditioning means comprises means for filtering each digitized information signal with respect to a signal characteristic selected from the group consisting of optimum selectivity, controlled phase response, and controlled amplitude response.

32. The communication unit of claim 25 further comprising conversion means, operatively coupled to the plurality of filtering means, for generating a composite analog transmission signal from the post-conditioned portion of the digitized signal of each filtering means.

33. The communication unit of claim 32 further comprising a frequency selection means, operatively coupled to the conversion means, for selecting a plurality of communication channels to transmit the composite analog transmission signal.

34. The communication unit of claim 33 wherein the frequency selection means comprises a frequency translator operatively coupled to a filter that selects the plurality of communication channels by selecting a portion of a electromagnetic spectrum to transmit the composite analog transmission signal.

35. The communication unit of claim 34 wherein the frequency translator comprises means for shifting the composite analog transmission signal to a predetermined intermediate frequency.

36. A communication receiving unit, comprising:
(a) input means for intercepting electromagnetic radiation within a frequency band;
(b) digitizing means, coupled to the input means, for digitizing a portion of the intercepted electromagnetic radiation into a digitized signal;
(c) a plurality of filtering means, coupled to the digitizing means, for pre-conditioning the digitized signal for subsequent Fourier transformation, each filtering means comprising:
  (i) an Nth order integrator;
  (ii) a first, a second, and a third Nth order differencer, each coupled to an output of the integrator, the second differencer being coupled through a first delay element, and the third differencer being coupled through the first and a second delay element;
  (iii) a first, a second, and a third multiplier, coupled to the first, the second, and the third differencer, respectively, for generating scaled outputs of each differencer, respectively; and
  (iv) summing means, coupled to the each of the multipliers, for generating a portion of the pre-conditioned digitized signal from the scaled outputs of the multipliers;
(d) Fourier transforming means, coupled to the plurality of filtering means, for generating a digitized channel signal from the pre-conditioned portions of the digitized signal;
(e) conditioning means, coupled to the Fourier transforming means, for removing undesired signals from the digitized channel signal; and
(f) detecting means, coupled to the conditioning means, for detecting an information signal within the digitized channel signal.

37. A communication transmitting unit, comprising:
(a) input means for receiving a plurality of digitized information signals to be transmitted;
(b) conditioning means, coupled to the input means, for removing undesired signals from the plurality of digitized information signals;
(c) inverse Fourier transforming means, coupled to the conditioning means, for generating a plurality of digitized signals from the plurality of digitized information signals;
(d) a plurality of filtering means, coupled to the inverse Fourier transforming means, for post-conditioning the plurality of digitized signals for subsequent transmission, each filtering means comprising:
  (i) an Nth order differencer;
  (ii) an Nth order integrator coupled to an output of the differencer;
  (iii) a first, a second, and a third multiplier, coupled to the integrator, for generating scaled outputs of the integrator, the second multiplier being coupled through a first delay element, and the third multiplier being coupled through the first and a second delay element; and
  (iv) summing means, coupled to each of the multipliers, for generating a portion of the post-conditioned digitized signal from the scaled outputs of the multipliers;
(e) conversion means, coupled to the plurality of filtering means, for generating a composite analog transmission signal from the portion of the post-conditioned digitized signal of each filtering means; and
(f) frequency selection means, coupled to the conversion means, for selecting a communication channel to transmit the composite analog transmission signal.

38. A method for processing a digitized signal, comprising the steps of:
(a) integrating portions of the digitized signal into an integrated signal;
(b) taking a difference of the integrated signal;
(c) multiplying the differenced integrated signal; and
(d) generating a digitized channel signal by Fourier transforming the multiplied integrated signal.

39. The method of claim 38:
(a) wherein the step of taking the difference comprises taking a first difference of the integrated signal and taking a second difference of delayed integrated signal;
(b) wherein the step of multiplying comprises multiplying the first and the second differenced integrated signals by scale factors; and
(c) further comprising the step of summing the first and the second multiplied integrated signals into a composite signal; and (d) wherein the generating step comprises generating the digitized channel signal by Fourier transforming the composite signal.

40. The method of claim 38 further comprises the steps of:
(a) intercepting electromagnetic radiation within a frequency band; and
(b) selecting a portion of the intercepted electromagnetic radiation; and
(c) digitizing the selected portion of the intercepted electromagnetic radiation into the digitized signal.

41. The method of claim 38 further comprises the step of removing undesired signals from the digitized channel signal.

42. The method of claim 38 further comprises the step of detecting an information signal within the digitized channel signal.

43. A method for processing a plurality of digitized information signals, comprising the steps of:
(a) generating a composite digitized channel signal by inverse Fourier transforming the plurality of digitized information signals;
(b) taking a difference of the composite digitized channel signal;
(c) integrating the differenced composite digitized channel signal into an integrated signal; and
(d) multiplying the integrated signal, by a scaling factor.

44. The method of claim 43:
(a) wherein the step of multiplying comprises multiplying the integrated signal to generate a first multiplied integrated signal and multiplying a delayed integrated signal to generate a second multiplied integrated signal; and
(b) further comprising the step of summing the first and the second multiplied integrated signals into a composite integrated signal.

45. The method of claim 43 further comprising the step of removing undesired signals from the plurality of digitized information signals prior to the generation of the composite digitized signal.

46. The method of claim 44 further comprising the step of generating a composite analog transmission signal from the composite integrated signal.

47. The method of claim 46 further comprising the step of selecting a plurality of communication channels to transmit the composite analog transmission signal.

48. A communication receiving unit, comprising:
(a) an analog-to-digital conversion means for digitizing a selected portion of an input frequency band;
(b) commutating means, operatively coupled to the analog-to-digital conversion means, for subdividing the digitized portion of the input frequency band into the plurality of digitized signal portions;
(c) discrete Fourier transforming means, operatively coupled to the commutating means, for generating a plurality of digitized channel signals by discrete Fourier transforming the plurality of digitized signal portions, the discrete Fourier transforming means comprising conditioning means for pre-conditioning the plurality of digitized signal portions with a modified cascaded integrator comb filter; and
(d) a detecting means, operatively coupled to the discrete Fourier transforming means, for detecting at least two information signals from the plurality of digitized channel signals.

49. The communication unit of claim 48 further comprising a frequency selection means, operatively coupled to the analog-to-digital conversion means, for intercepting and providing the selected portion of the input frequency band.

50. The communication unit of claim 49 wherein the frequency selection means comprises a filter that selects a portion of an electrical signal which represents the intercepted electromagnetic radiation within a particular portion of the frequency band.

51. The communication unit of claim 49 wherein the frequency selection means comprises a frequency translator operatively coupled to a filter that selects a portion of an electrical signal which represents the intercepted electromagnetic radiation within a particular portion of the frequency band.

52. The communication unit of claim 48 wherein the conditioning means comprises means for filtering each digitized signal portion with respect to a signal characteristic selected from the group consisting of optimum selectivity, controlled phase response, and controlled amplitude response.

53. The communication unit of claim 48 wherein each information signal conforms with a signal coding and channelization standard selected from the group consisting of frequency division multiple access, time division multiple access, and frequency hopping code division multiple access.

54. A communication transmitting unit, comprising:
(a) inverse discrete Fourier transforming means for generating a plurality of digitized signals by inverse discrete Fourier transforming a plurality of input digitized information signals, the inverse discrete Fourier transforming means comprising conditioning means for post-conditioning the plurality of digitized signals with a modified cascaded integrator comb filter;
(b) commutating means, operatively coupled to the inverse discrete Fourier transforming means, for combining portions of the plurality of digitized signals into a composite digitized signal;
(c) digital-to-analog conversion means, operatively coupled to the commutating means, for generating a composite analog transmission signal from the composite digitized signal; and
(d) transmitting means, operatively coupled to the digital-to-analog conversion means, for transmitting the composite analog transmission signal over a frequency band.

55. The communication unit of claim 54 wherein each information signal conforms with a signal coding and channelization standard selected from the group consisting of frequency division multiple access, time division multiple access, and frequency hopping code division multiple access.

56. The communication unit of claim 54 wherein the conditioning means comprises means for filtering each digitized signal with respect to a signal characteristic selected from the group consisting of optimum selectivity, controlled phase response, and controlled amplitude response.

57. The communication unit of claim 54 further comprising a frequency selection means, operatively coupled to the digital-to-analog conversion means and the transmitting means, for selecting the portion of the frequency band that the composite analog transmission signal is to be transmitted.

58. The communication unit of claim 57 wherein the frequency selection means comprises a filter that selects a portion of an electrical signal which represents electromagnetic radiation within a particular portion of the frequency band.

59. The communication unit of claim 57 wherein the frequency selection means comprises a frequency translator operatively coupled to a filter that selects a portion of an electrical signal which represents electromagnetic radiation within a particular portion of the frequency band.

* * * * *